United States Patent
Naito et al.

(10) Patent No.: US 11,710,797 B2
(45) Date of Patent: Jul. 25, 2023

(54) TRANSPARENT ELECTRODE, DEVICE EMPLOYING THE SAME, AND MANUFACTURING METHOD OF THE DEVICE

(71) Applicant: KABUSHIKI KAISHA TOSHIBA, Minato-ku (JP)

(72) Inventors: Katsuyuki Naito, Bunkyo (JP); Naomi Shida, Minato (JP); Mitsunaga Saito, Inzai (JP); Takeshi Niimoto, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 572 days.

(21) Appl. No.: 15/919,272

(22) Filed: Mar. 13, 2018

(65) Prior Publication Data
US 2019/0081190 A1    Mar. 14, 2019

(30) Foreign Application Priority Data
Sep. 8, 2017   (JP) .................................. 2017-173312

(51) Int. Cl.
  *H01L 29/76*   (2006.01)
  *H01L 31/0224*   (2006.01)
  (Continued)

(52) U.S. Cl.
  CPC .... *H01L 31/022491* (2013.01); *C03C 17/245* (2013.01); *C03C 17/42* (2013.01);
  (Continued)

(58) Field of Classification Search
  CPC ......... H01L 31/022491; H01L 29/4908; H01L 31/02164; H01L 31/022475;
  (Continued)

(56) References Cited

U.S. PATENT DOCUMENTS 4,496,788 A * 1/1985 Hamakawa ....... H01L 31/03685
                                                             136/249
4,666,569 A * 5/1987 Basol .................... H01L 21/443
                                                             136/256
(Continued)

FOREIGN PATENT DOCUMENTS

JP   2003-203681 A   7/2003
JP   2010-87105 A    4/2010
(Continued)

OTHER PUBLICATIONS

Otiti, "Zinc Oxide Materials for Photovoltaic Applications", Grant No. FA9550-11-1-0074; AF Office of Scientific Research; 875 N. Randoplh St. Room 3112, Arlington, VA 22203 (Year: 2014).*
(Continued)

*Primary Examiner* — Ismail A Muse
(74) *Attorney, Agent, or Firm* — Oblon, McClelland, Maier & Neustadt, L.L.P.

(57) ABSTRACT

The present embodiments provide a transparent electrode having a laminate structure of: a metal oxide layer having an amorphous structure and electroconductivity, and a metal nanowire layer; and further comprising an auxiliary metal wiring. The auxiliary metal wiring covers a part of the metal nanowire layer or of the metal oxide layer, and is connected to the metal nanowire layer.

15 Claims, 7 Drawing Sheets

(51) Int. Cl.

| | |
|---|---|
| *C23C 14/06* | (2006.01) |
| *H01L 31/0216* | (2014.01) |
| *H01L 29/49* | (2006.01) |
| *C03C 17/245* | (2006.01) |
| *H01L 31/18* | (2006.01) |
| *C03C 17/42* | (2006.01) |
| *H10K 30/30* | (2023.01) |
| *H10K 30/82* | (2023.01) |

(52) U.S. Cl.
CPC ...... *C23C 14/0682* (2013.01); *H01L 29/4908* (2013.01); *H01L 31/02164* (2013.01); *H01L 31/022466* (2013.01); *H01L 31/022475* (2013.01); *H01L 31/022483* (2013.01); *H01L 31/1884* (2013.01); *H10K 30/30* (2023.02); *H10K 30/82* (2023.02); *C03C 2217/948* (2013.01)

(58) Field of Classification Search
CPC ......... H01L 31/022483; H01L 31/1884; C23C 14/0682; C03C 17/245
USPC ........................................................ 257/288
See application file for complete search history.

(56) References Cited

U.S. PATENT DOCUMENTS

| | | | |
|---|---|---|---|
| 5,650,201 A * | 7/1997 | Tompa | C23C 14/0658 427/255.394 |
| 5,731,856 A * | 3/1998 | Kim | G02F 1/1345 349/147 |
| 5,744,864 A * | 4/1998 | Cillessen | H01L 29/7869 257/749 |
| 6,166,319 A * | 12/2000 | Matsuyama | H01L 21/67155 136/249 |
| 6,180,870 B1 * | 1/2001 | Sano | H01L 31/076 136/258 |
| 6,294,274 B1 * | 9/2001 | Kawazoe | C03C 17/23 320/101 |
| 6,563,174 B2 * | 5/2003 | Kawasaki | H01L 29/4908 257/350 |
| 6,727,522 B1 * | 4/2004 | Kawasaki | H01L 29/517 257/103 |
| 7,061,014 B2 * | 6/2006 | Hosono | C30B 23/02 257/43 |
| 7,105,868 B2 * | 9/2006 | Nause | H01L 29/22 257/192 |
| 7,211,825 B2 * | 5/2007 | Shih | H01L 29/78633 257/13 |
| 7,297,977 B2 * | 11/2007 | Hoffman | H01L 29/7869 257/43 |
| 7,323,356 B2 * | 1/2008 | Hosono | C30B 23/02 117/8 |
| 7,385,224 B2 * | 6/2008 | Ishii | H01L 29/41733 257/59 |
| 7,402,506 B2 * | 7/2008 | Levy | B82Y 10/00 438/584 |
| 7,411,209 B2 * | 8/2008 | Endo | H01L 21/265 257/288 |
| 7,453,087 B2 * | 11/2008 | Iwasaki | H01L 29/7869 257/292 |
| 7,501,293 B2 * | 3/2009 | Ito | H01L 29/7869 257/102 |
| 7,923,711 B2 * | 4/2011 | Shima | H01L 45/04 257/2 |
| 7,952,668 B2 * | 5/2011 | Kakinuma | G02F 1/1334 349/122 |
| 7,994,500 B2 * | 8/2011 | Kim | H01L 29/7869 257/258 |
| 8,018,568 B2 * | 9/2011 | Allemand | H01L 51/0021 349/187 |
| 8,049,333 B2 * | 11/2011 | Alden | B82Y 30/00 257/741 |
| 8,058,645 B2 * | 11/2011 | Jeong | H01L 29/7869 257/43 |
| 8,148,779 B2 * | 4/2012 | Jeong | H01L 29/4908 257/347 |
| 8,174,667 B2 * | 5/2012 | Allemand | H01B 1/22 349/187 |
| 8,188,480 B2 * | 5/2012 | Itai | H01L 29/78618 257/288 |
| 8,203,143 B2 * | 6/2012 | Imai | H01L 29/78696 257/43 |
| 8,293,595 B2 * | 10/2012 | Yamazaki | H01L 27/3241 438/158 |
| 8,502,221 B2 * | 8/2013 | Yamazaki | H01L 29/7869 257/43 |
| 8,557,877 B2 * | 10/2013 | Mukhopadhyay | C03C 17/30 516/34 |
| 8,722,442 B2 * | 5/2014 | Kim | H01L 51/5206 438/45 |
| 8,884,282 B2 * | 11/2014 | Yamazaki | H01L 29/517 257/43 |
| 9,059,295 B2 * | 6/2015 | Yamazaki | H01L 51/0516 |
| 9,147,768 B2 * | 9/2015 | Yamazaki | H01L 29/4908 |
| 9,190,522 B2 * | 11/2015 | Yamazaki | H01L 29/7869 |
| 9,190,525 B2 * | 11/2015 | Yamazaki | H01L 29/7869 |
| 9,196,739 B2 * | 11/2015 | Yamazaki | H01L 29/7869 |
| 9,230,707 B2 | 1/2016 | Chung et al. | |
| 9,304,635 B2 * | 4/2016 | Fujino | C22C 9/00 |
| 9,373,741 B2 * | 6/2016 | Fogel | H01L 31/035227 |
| 9,590,112 B2 * | 3/2017 | Yamazaki | H01L 29/42384 |
| 9,805,837 B2 * | 10/2017 | Sasa | C23C 14/086 |
| 10,002,971 B2 * | 6/2018 | Jintyou | H01L 29/78696 |
| 10,096,718 B2 * | 10/2018 | Asami | H01L 27/1052 |
| 10,158,008 B2 * | 12/2018 | Koezuka | H01L 21/0217 |
| 10,270,010 B2 * | 4/2019 | Kuchiyama | H01L 31/0392 |
| 10,305,063 B2 * | 5/2019 | Kuroki | H01L 51/5203 |
| 2001/0046027 A1 * | 11/2001 | Tai | G02F 1/134363 349/159 |
| 2002/0014624 A1 * | 2/2002 | Yamazaki | G02B 27/017 257/57 |
| 2002/0056838 A1 * | 5/2002 | Ogawa | G02F 1/13439 257/59 |
| 2002/0132454 A1 * | 9/2002 | Ohtsu | C23C 14/083 438/486 |
| 2003/0189401 A1 * | 10/2003 | Kido | C07C 211/58 313/504 |
| 2003/0218222 A1 * | 11/2003 | Wager | H01L 29/02 257/410 |
| 2004/0038446 A1 * | 2/2004 | Takeda | C30B 23/02 438/104 |
| 2004/0127038 A1 * | 7/2004 | Carcia | C23C 14/086 438/689 |
| 2005/0017302 A1 * | 1/2005 | Hoffman | H01L 29/105 257/347 |
| 2005/0199959 A1 * | 9/2005 | Chiang | H01L 29/7869 257/368 |
| 2006/0043377 A1 * | 3/2006 | Hoffman | H01L 29/7869 257/72 |
| 2006/0091793 A1 * | 5/2006 | Baude | H01L 27/3244 313/506 |
| 2006/0108529 A1 * | 5/2006 | Saito | H01L 27/14601 250/338.4 |
| 2006/0108636 A1 * | 5/2006 | Sano | H01L 21/428 257/347 |
| 2006/0110867 A1 * | 5/2006 | Yabuta | H01L 29/78618 438/151 |
| 2006/0113536 A1 * | 6/2006 | Kumomi | H01L 27/14621 257/57 |
| 2006/0113539 A1 * | 6/2006 | Sano | H01L 29/51 257/59 |
| 2006/0113549 A1 * | 6/2006 | Den | G03G 5/08 257/79 |
| 2006/0113565 A1 * | 6/2006 | Abe | H01L 29/7869 257/197 |

(56) References Cited

U.S. PATENT DOCUMENTS

| | | | |
|---|---|---|---|
| 2006/0169973 A1* | 8/2006 | Isa | H01L 51/0022 257/40 |
| 2006/0170111 A1* | 8/2006 | Isa | H01L 21/288 257/775 |
| 2006/0197092 A1* | 9/2006 | Hoffman | H01L 29/7869 257/72 |
| 2006/0208977 A1* | 9/2006 | Kimura | G09G 3/2014 345/76 |
| 2006/0228974 A1* | 10/2006 | Thelss | H01L 29/7869 445/24 |
| 2006/0231882 A1* | 10/2006 | Kim | G01N 27/4141 257/310 |
| 2006/0238135 A1* | 10/2006 | Kimura | G09G 3/20 315/169.3 |
| 2006/0244107 A1* | 11/2006 | Sugihara | H01L 29/7869 257/646 |
| 2006/0284171 A1* | 12/2006 | Levy | B82Y 10/00 257/43 |
| 2006/0284172 A1* | 12/2006 | Ishii | H01L 29/66969 257/43 |
| 2006/0292777 A1* | 12/2006 | Dunbar | H01L 21/02554 438/197 |
| 2007/0024187 A1* | 2/2007 | Shin | H01L 51/5281 313/504 |
| 2007/0046191 A1* | 3/2007 | Saito | H01L 27/1248 313/506 |
| 2007/0052025 A1* | 3/2007 | Yabuta | H01L 29/7869 257/347 |
| 2007/0054507 A1* | 3/2007 | Kaji | H01L 21/02554 438/795 |
| 2007/0090365 A1* | 4/2007 | Hayashi | G02F 1/1368 257/72 |
| 2007/0108446 A1* | 5/2007 | Akimoto | H01L 29/78621 257/61 |
| 2007/0152217 A1* | 7/2007 | Lai | H01L 27/1225 257/59 |
| 2007/0172591 A1* | 7/2007 | Seo | C23C 16/0272 427/248.1 |
| 2007/0187678 A1* | 8/2007 | Hirao | H01L 21/02422 257/43 |
| 2007/0187760 A1* | 8/2007 | Furuta | H01L 29/41733 257/347 |
| 2007/0194379 A1* | 8/2007 | Hosono | C23C 14/0021 257/347 |
| 2007/0252928 A1* | 11/2007 | Ito | G02F 1/1362 349/106 |
| 2007/0272922 A1* | 11/2007 | Kim | H01L 29/7869 257/43 |
| 2007/0287296 A1* | 12/2007 | Chang | H01L 21/465 438/706 |
| 2008/0006877 A1* | 1/2008 | Mardilovich | H01L 21/312 257/347 |
| 2008/0038882 A1* | 2/2008 | Takechi | H01L 29/4908 438/151 |
| 2008/0038929 A1* | 2/2008 | Chang | H01L 31/1884 438/722 |
| 2008/0050595 A1* | 2/2008 | Nakagawara | C23C 14/086 428/412 |
| 2008/0073653 A1* | 3/2008 | Iwasaki | H01L 29/7869 257/79 |
| 2008/0083950 A1* | 4/2008 | Pan | B82Y 10/00 257/347 |
| 2008/0106191 A1* | 5/2008 | Kawase | H01L 27/3225 313/504 |
| 2008/0128689 A1* | 6/2008 | Lee | H01L 29/7869 257/43 |
| 2008/0129195 A1* | 6/2008 | Ishizaki | H01L 27/322 313/504 |
| 2008/0166834 A1* | 7/2008 | Kim | H01L 29/7869 438/104 |
| 2008/0169019 A1* | 7/2008 | Korevaar | H01L 31/022425 136/251 |
| 2008/0182358 A1* | 7/2008 | Cowdery-Corvan | C23C 16/407 438/104 |
| 2008/0224133 A1* | 9/2008 | Park | H01L 21/02554 257/43 |
| 2008/0258139 A1* | 10/2008 | Ito | H01L 29/7869 257/43 |
| 2008/0258140 A1* | 10/2008 | Lee | H01L 21/02554 257/43 |
| 2008/0258141 A1* | 10/2008 | Park | H01L 29/78618 257/43 |
| 2008/0258143 A1* | 10/2008 | Kim | H01L 29/458 257/43 |
| 2008/0296568 A1* | 12/2008 | Ryu | H01L 21/02554 257/43 |
| 2008/0299702 A1* | 12/2008 | Son | H01L 29/7869 438/104 |
| 2008/0308806 A1* | 12/2008 | Akimoto | H01L 27/1285 257/59 |
| 2009/0026926 A1* | 1/2009 | Shirata | H01L 31/022466 313/504 |
| 2009/0073325 A1* | 3/2009 | Kuwabara | H01L 21/288 348/790 |
| 2009/0114910 A1* | 5/2009 | Chang | H01L 29/78603 257/43 |
| 2009/0134399 A1* | 5/2009 | Sakakura | H01L 27/3244 257/72 |
| 2009/0152506 A1* | 6/2009 | Umeda | C30B 1/02 252/500 |
| 2009/0152541 A1* | 6/2009 | Maekawa | H01L 29/41733 257/43 |
| 2009/0261325 A1* | 10/2009 | Kawamura | H01L 27/1214 257/43 |
| 2010/0015417 A1* | 1/2010 | Nakajima | C23C 14/086 428/195.1 |
| 2010/0025677 A1* | 2/2010 | Yamazaki | H01L 27/1225 257/43 |
| 2010/0032665 A1* | 2/2010 | Yamazaki | H01L 29/78618 257/43 |
| 2010/0065844 A1* | 3/2010 | Tokunaga | H01L 29/78606 257/43 |
| 2010/0084013 A1* | 4/2010 | Eo | H01L 31/022466 136/255 |
| 2010/0092800 A1* | 4/2010 | Itagaki | C30B 23/025 428/697 |
| 2010/0102314 A1* | 4/2010 | Miyairi | H01L 29/42384 257/43 |
| 2010/0109002 A1* | 5/2010 | Itagaki | H01L 29/247 257/43 |
| 2010/0117079 A1* | 5/2010 | Miyairi | H01L 27/1225 257/43 |
| 2010/0175748 A1* | 7/2010 | Karg | H01L 31/0352 136/256 |
| 2010/0197068 A1* | 8/2010 | Poon | H01L 31/1884 438/63 |
| 2010/0295042 A1* | 11/2010 | Yano | H01L 29/7869 257/43 |
| 2010/0311103 A1 | 12/2010 | Boukherroub et al. | |
| 2011/0039097 A1* | 2/2011 | Murashige | H05K 1/11 428/337 |
| 2011/0065216 A1* | 3/2011 | Kaji | H01L 22/14 438/16 |
| 2011/0101335 A1* | 5/2011 | Yamazaki | H01L 29/518 257/43 |
| 2011/0180802 A1* | 7/2011 | Morosawa | H01L 29/7869 257/59 |
| 2011/0201206 A1* | 8/2011 | Ishikawa | H01L 21/02115 438/703 |
| 2011/0226325 A1 | 9/2011 | Morooka et al. | |
| 2011/0281070 A1 | 11/2011 | Mittal | |
| 2012/0048364 A1* | 3/2012 | Auvray | H01L 31/02168 136/256 |
| 2012/0068250 A1* | 3/2012 | Ino | H01L 27/11568 257/321 |
| 2012/0097232 A1* | 4/2012 | Kim | H01L 31/035281 136/255 |

(56) References Cited

U.S. PATENT DOCUMENTS

| | | | |
|---|---|---|---|
| 2012/0119205 A1* | 5/2012 | Taniguchi | H01L 29/7869 257/43 |
| 2013/0040516 A1* | 2/2013 | Pruneri | C03C 17/3671 442/1 |
| 2013/0099224 A1 | 4/2013 | Iljima et al. | |
| 2013/0146132 A1* | 6/2013 | Kuchiyama | H01L 31/0747 136/255 |
| 2013/0146134 A1* | 6/2013 | Hsiao | H01L 31/022483 136/256 |
| 2013/0233382 A1* | 9/2013 | Kobayashi | H01L 31/03923 136/256 |
| 2014/0060613 A1 | 3/2014 | So et al. | |
| 2014/0144510 A1* | 5/2014 | Hiraga | H01L 31/022425 136/264 |
| 2014/0290987 A1 | 10/2014 | Yang et al. | |
| 2014/0295179 A1* | 10/2014 | Naito | C08J 7/06 428/408 |
| 2015/0171116 A1* | 6/2015 | Okazaki | H01L 27/1225 257/43 |
| 2015/0221413 A1 | 8/2015 | Abe et al. | |
| 2015/0280026 A1* | 10/2015 | Di | H01L 31/022466 136/256 |
| 2016/0118502 A1* | 4/2016 | Yamazaki | H01L 21/02323 257/43 |
| 2016/0276611 A1* | 9/2016 | Oooka | H01L 27/301 |
| 2016/0357290 A1* | 12/2016 | Kanna | B32B 27/325 |
| 2017/0068359 A1* | 3/2017 | Ahn | G06F 3/0446 |
| 2018/0113525 A1* | 4/2018 | Kweon | G06F 3/041 |
| 2018/0170263 A1* | 6/2018 | Heintzelman | G02B 27/0101 |
| 2018/0240886 A1* | 8/2018 | Venugopal | H01L 29/778 |
| 2019/0006614 A1* | 1/2019 | Kuroki | H01L 51/5212 |
| 2019/0027622 A1* | 1/2019 | Shida | H01L 31/022483 |

FOREIGN PATENT DOCUMENTS

| | | |
|---|---|---|
| JP | 2010-525526 A | 7/2010 |
| JP | 2010-258205 | 11/2010 |
| JP | 2011-506945 | 3/2011 |
| JP | 2011-216460 | 10/2011 |
| JP | 2012-216484 | 11/2012 |
| JP | 2012-219301 | 11/2012 |
| JP | 2013-521595 | 6/2013 |
| JP | 2014-511041 | 5/2014 |
| JP | 2015-501534 | 1/2015 |
| JP | 2015-74163 A | 4/2015 |
| JP | 5869627 B2 | 2/2016 |
| JP | 5993028 B2 | 9/2016 |
| WO | WO 2014/073597 A1 | 5/2014 |

OTHER PUBLICATIONS

Hsiao et al, "Properties of Zinc Oxide Doped Indium, Magnesium and Aluminum Oxide Films used on Flexible Substrates", Mater. Res. Soc. Symp. Proc. vol. 1035 (c) 2008 Material Research Society. (Year: 2008).*

Wang et al., "Nitrogen-doped graphene as transparent counter electrode for efficient dye-sensitized solar cells", Materials Research Bulletin 47 (2012) 4252-4256 (Year: 2012).*

Technology of transparent conductive oxide thin-films, 2007, 7 pages (with English translation).

* cited by examiner

TRANSPARENT ELECTRODE, DEVICE EMPLOYING THE SAME, AND MANUFACTURING METHOD OF THE DEVICE

CROSS-REFERENCE TO RELATED APPLICATIONS

This application is based upon and claims the benefit of priority from the prior Japanese Patent Application No. 2017-173312, filed on Sep. 8, 2017, the entire contents of which are incorporated herein by reference.

FIELD

Embodiments of the present disclosure relate to a transparent electrode, a device employing the electrode, and a manufacturing method of the device.

BACKGROUND

According to recent increasing of energy consumption, demand for alternative energy replacing fossil fuels has been rising as measures to cope with global warming. As a source of the alternative energy, solar cells have been attracted the attention and hence progressively developed. They are studied for various practical applications. From a practical viewpoint, it is particularly important to improve their flexibility and durability so that they can be installed on various places. However, single crystal silicon solar cells, which are the most basic solar cells, are expensive and it is difficult to produce flexible ones. On the other hand, organic solar cells and organic-inorganic hybrid solar cells, in which many researchers have been lately interested, have room for improvement in durability.

In addition to the above solar cells, other photoelectric conversion devices, such as organic EL devices and photosensors, have been also researched with the aim of improving their flexibility and durability. Those devices usually comprise indium-doped tin oxide (hereinafter, often referred to as "ITO") in the form of films serving as transparent electrodes. The ITO films are normally formed by sputtering or the like. In order that the ITO films can have high electroconductivity, it is necessary to carry out the sputtering procedure at a high temperature and to anneal thereafter the formed films at a high temperature. However, it is often the case that organic materials cannot be subjected to those procedures at a high temperature. In view of that, it is examined to combine the ITO film with other electroconductive materials. For example, there is a known electrode in which an ITO layer formed by wet-coating is combined with a composite film of silver nanowires and electroconductive polymer. However, that electrode is often damaged by corrosive substances which are generated in an active layer or the like and then which permeate through the ITO film. It is difficult to prevent those substances from corroding the silver nanowires. Further, the coating solution for forming the ITO layer cannot be applied on a layer which is feared to be damaged by the solution.

DETAILED DESCRIPTION

Embodiments will now be explained with reference to the accompanying drawings.

The transparent electrode according to the embodiment has a laminate structure of: a metal oxide layer having an amorphous structure and electroconductivity, and a metal nanowire layer; and further comprises an auxiliary metal wiring which covers a part of said metal nanowire layer or of said metal oxide layer and which is connected to said metal nanowire layer.

Further, the device according to the embodiment, comprises:
 the above transparent electrode,
 an active layer, and
 a counter electrode.

Furthermore, the method according to the embodiment for manufacturing a device, comprises the steps of:
(a) forming an active layer on a counter electrode,
(b) forming, on said active layer, a metal oxide layer having an amorphous structure and electroconductivity, and
(c) forming a metal nanowire layer on said metal oxide layer, and further
(d) forming, before or after said step (c), an auxiliary metal wiring which covers a part of said metal nanowire layer or of said metal oxide layer and which is connected to said metal nanowire layer.

The embodiments are described below in detail.

Embodiment 1

Figure 1:
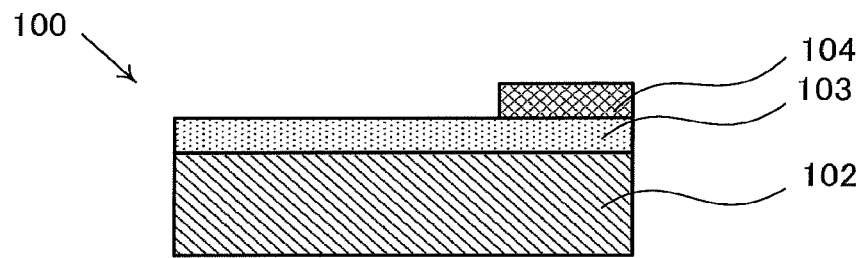
FIG. 1 is a schematic sectional view showing the structure of a transparent electrode according to the embodiment.

First, the structure of a transparent electrode according to the first embodiment is explained with reference to FIG. 1. FIG. 1 schematically shows the structure of a transparent electrode 100 according to the embodiment. The transparent electrode has a laminate structure comprising, at least, a metal oxide layer 102 and a metal nanowire layer 103. The metal oxide layer 102 has an amorphous structure and electroconductivity. The transparent electrode further comprises an auxiliary metal wiring 104. In this embodiment, the auxiliary metal wiring is connected to the metal nanowire layer so that electrical conduction can be established therebetween. Further, the auxiliary metal wiring covers a part of the metal nanowire layer. This means that the auxiliary metal wiring lies on only a part of the surface of the metal nanowire layer and hence is absent on the residual part of the surface. Accordingly, in this structure, light can penetrate through the part not covered with the auxiliary metal wiring, so that the electrode 100 can serve as a transparent electrode. Specifically, the area occupied by the auxiliary metal wiring is preferably 1 to 30%, more preferably 2 to 10% of the whole surface of the metal nanowire layer.

The metal oxide layer 102 is an electroconductive layer comprising an electroconductive metal oxide having an amorphous structure. The amorphous inorganic metal oxide can be freely selected from generally known oxides. Examples thereof include: indium-doped tin oxide (ITO), fluorine-doped tin oxide (FTO), and aluminum-doped zinc oxide (AZO). The amorphous inorganic metal oxide is preferably highly transparent in the form of a film. Further, the metal oxide layer preferably has continuity.

Here, the "continuity" means that crystalline parts existing in the layer do not penetrate in the thickness direction. In the embodiment, the metal oxide layer necessarily has an amorphous structure. If the whole metal oxide layer consists only of the amorphous structure and hence does not comprise any crystalline structure, the layer has continuity. However, if the metal oxide layer partly contains crystalline parts, there are "gaps" among crystallites contained therein. Accordingly, if the layer contains many crystallites, the gaps are aligned in series in the thickness direction to form a penetrating cavity. The penetrating cavity may serve as a path through which silver, acids or halogens can diffuse, and therefore the layer needs to have a structure in which the above path is not formed for the purpose of preventing the diffusion of silver, acids or halogens.

Even if the metal oxide layer may contain crystalline parts, it can be said that "the layer has continuity" provided that there are only a small number of or, particularly, no penetrating cavities formed by the crystalline parts aligned in series in the thickness direction. The metal oxide in amorphous state and that in crystalline state are different in reflection and transmission of electron beams and hence show distinguishably different contrasts in an electron microscopic image. Further, it can be judged by high-resolution observation whether the layer contains crystal lattices or not. It is, therefore, possible to electron-microscopically observe a penetrating cavity formed by the crystalline metal oxide. Thus, whether the metal oxide layer has continuity or not can be judged by observing a section of the metal oxide layer with an electron microscope.

Specifically, the continuity can be evaluated in the following manner. A section of the metal oxide layer is observed at a magnification of 100000 times. The objective section is divided into ten 1000 nm-width observed areas, which are individually evaluated. If the penetrating cavities are visually confirmed only in two or less of the ten observed areas, the metal oxide layer is considered to have continuity in the embodiment. The penetrating cavities are preferably found in zero of the ten areas. In other words, it is preferred that no penetrating cavities be found in any of the ten areas.

How much ITO is crystallized can be estimated from the X-ray diffraction pattern thereof. Specifically, amorphous ITO shows a diffraction pattern in which the peak corresponding to the (222) crystal plane is clearly observed at about $2\theta=30°$ but that corresponding to the (400) crystal plane is absent at about 35°. In contrast, however, according as crystallites increase, the peak of (400) grows but that of (222) shrinks. This fact is described in "TOMEI DENKYO-KUMAKU NO GIJUTSU [in Japanese] (technology for transparent electrode film)", published by Ohmsha, Ltd., written by Hiroshi Kimura, Satoshi Ishihara, Yosio Suzuki, Takashi Ito (page 137, FIG. 5•19 titled "substrate temperature dependence of X-ray diffraction pattern of ITO film in formation process" according to Kimura et al.). In the embodiment, the peak of (222) is preferably higher than that of (400), and further preferably twice or more, particularly preferably four times or more the height of the peak of (400).

The metal oxide layer having an amorphous structure can be formed, for example, by sputtering at a low temperature. The formed metal oxide film may be annealed to partly crystallize to produce a continuous composite film.

If necessary, the metal oxide layer 102 may be combined with highly electroconductive substances, such as, metals. There are no particular restrictions on the way of combination. For example, the metal oxide layer is preferably stacked with a metal thin film. As the metal, silver or a silver alloy is preferred. Examples of the silver alloy include: silver-palladium, silver-gold, and silver-tin. There are also no particular restrictions on the stacking order of the metal thin film and the film containing an amorphous inorganic oxide. However, the metal thin film is preferably sandwiched between inorganic oxide films. Examples of preferred structures include: ITO/silver alloy/ITO, FTO/silver alloy/FTO, and ZnO/silver alloy/ZnO. In those structures, the upper and lower metal oxide films may contain different metal oxides and also may have different thicknesses. The film near to the surface or to the active layer is preferably thicker than the opposite metal oxide film, so as to reduce deterioration of the silver alloy layer.

If the silver alloy layer is thickened, the resistance is decreased but the transparency is impaired. In view of that, the thickness thereof is preferably 10 to 50 nm. If the silver alloy layer has a low resistance, it becomes possible to reduce the amount of the metal nanowires or the area of the auxiliary metal wiring.

The metal nanowire layer 103 normally comprises metal nanowires having diameters of 10 to 500 nm and lengths of 0.1 to 50 µm. The diameter and length of metal nanowires can be determined, for example, by analysis of SEM images according to scanning electron microscopy (SEM). In the embodiment, preferred are nanowires of silver, silver alloy, copper or copper alloy having the above diameter and length. Among them, silver nanowires are particularly preferred.

A plural number of the nanowires are partly contacted or fused with each other to form a network structure, such as, a mesh structure or a lattice structure. Thus, plural electroconductive paths are formed, and consequently conductive clusters are constructed all over the layer (percolation conduction theory). In order to form those conductive clusters, the nanowires need to have a certain degree of number density. In general, the longer the nanowires are, the more easily the conductive clusters are formed. Further, the larger diameter the nanowires have, the larger conductivity the resultant layer has. Since the nanowires thus form a network structure, it is possible to realize high electroconductivity in total even if the amount of metal is small. In addition, the resultant nanowire layer has the advantage of flexibility.

If the nanowires have too small a diameter, the resistance thereof tends to increase. On the other hand, if the diameter is too large, light-scattering may increase to lower the transparency. Those disadvantages can be avoided if the silver nanowires have a diameter of 20 to 150 nm. The nanowire diameter is more preferably 35 to 120 nm.

If the nanowires have too short a length, the conductive clusters are formed insufficiently and accordingly the resistance tends to increase. On the other hand, if the length is too long, the nanowires tend to be dispersed unstably in a solvent when the electrode or the like is produced. Those disadvantages can be avoided if the silver nanowires have a length of 1 to 40 µm. The nanowire length is more preferably 5 to 30 µm.

The metal nanowires can be produced in desired manners. For example, silver nanowires can be obtained by reducing an aqueous silver ion solution with various reducing agents. The reducing agent, protective polymer and coexistent ions can be selected to control the shape and size of the resultant silver nanowires. For producing silver nanowires, a multivalent alcohol, such as ethylene glycol, and polyvinylpyrrolidone are preferably adopted as the reducing agent and the protective polymer, respectively. From those starting materials, what is called nanowires in a nano-order size can be obtained.

The metal nanowire layer can contain metal nanoparticles. For example, the silver nanowire layer may contain silver nanoparticles. The silver nanowires and the silver nanoparticles are likely to aggregate together, and the silver nanoparticles serve as an adhesive to well combine the silver nanoparticles each other. As a result, the nanoparticles lower the electrical resistance of the layer as an electroconductive film.

The auxiliary metal wiring 104 functions as a current collector. The auxiliary metal wiring is preferably made of silver, gold, copper, molybdenum, aluminum or an alloy thereof. The auxiliary metal wiring may be partly in contact with the metal oxide layer, so as to enhance the electrical conduction therebetween. For example, the auxiliary metal wiring on the surface of the metal nanowire layer may partly penetrate through the metal nanowire layer to connect with the metal oxide layer. The auxiliary metal wiring may be placed between the metal nanowire layer and the metal oxide layer. In that structure, it is easy to keep the auxiliary metal wiring in contact with both the metal nanowire layer and the metal oxide layer.

The auxiliary metal wiring 104 covers a part of the metal nanowire layer or of the metal oxide layer. However, there are no particular restrictions on the shape thereof as long as an area not covered with the auxiliary metal wiring can be visually confirmed when seen from the surface. For example, the auxiliary metal wiring can be in the shape of lines, a comb or a mesh.

Both the metal oxide layer and the metal nanowire layer preferably have low surface resistances. In addition, the metal oxide layer 102 preferably has a larger surface resistance than the metal nanowire layer 103. When incorporated in a device, the transparent electrode having that structure makes it possible to evenly apply voltage on or flow a current to the active layer of the device.

It is possible to form a graphene layer between the metal oxide layer 102 and the metal nanowire layer 103. Further, the graphene layer may be so placed on the upper side of the metal nanowire layer as to cover the metal nanowire layer and the auxiliary metal wiring.

The graphene layer preferably has a laminate structure of 1 or more but 4 or less graphene monomolecular films (hereinafter, often referred to as "monolayer graphenes") on average. The graphene layer is preferably either unsubstituted or doped with nitrogen or boron. The unsubstituted or boron-doped graphene layer is preferably used in an anode while the nitrogen-doped graphene layer is preferably used in a cathode. The doping amount (N/C atomic ratio) can be measured by XPS, and is preferably 0.1 to 30 atom %, more preferably 1 to 10 atom %. The graphene layer has such high shielding ability as to prevent acids and halogens from diffusing and thereby to avoid deterioration of the metal oxide and the metal. As a result, the impurities coming from the outside can be prevented by the graphene layer from entering the photoelectric conversion layer. Further, since containing nitrogen atoms, the nitrogen-doped graphene layer has high acid-trapping ability and hence has higher shielding ability. In view of that, the graphene layer can be said to be a shielding layer. The boron-doped graphene layer is preferably used in an anode. The doping amount (B/C atomic ratio) can be measured by XPS, and is preferably 0.1 to 30 atom %, more preferably 1 to 10 atom %.

It is preferred to provide an insulating layer of polymer or of insulating metal oxide on the metal nanowire 103 and the auxiliary metal wiring 104. The insulating layer further preferably can function also as a UV-cut layer or a gas-barrier layer.

In order to serve as a UV-cut layer, the insulating layer preferably contains an ultraviolet absorber. Examples of the ultraviolet absorber include: benzophenones, such as, 2-hydroxy-4-methoxy-benzophenone, 2,2-dihydroxy-4-methoxybenzophenone, 2-hydroxy-4-methoxy-2-carboxybenzophenone, and 2-hydroxy-4-n-octoxybenzophenone; benzotriazoles, such as, 2-(2-hydroxy-3,5-di-t-butylphenyl) benzotriazole, 2-(2-hydroxy-5-methylphenyl)benzotriazole, and 2-(2-hydroxy-5-n-octylphenyl)benzotriazole; and salicylic esters, such as, phenyl salicylate and p-octylphenyl salicylate. The absorbers are preferably capable of cutting UV light in the wavelength range of 400 nm or less.

The gas-barrier layer blocks preferably water vapor and oxygen, particularly preferably water vapor. This layer is preferably, for example, a film of inorganic substance such as SiN, $SiO_2$, SiC, $SiO_xN_y$, $TiO_2$ or $Al_2O_3$. Further, it may be a super-thin glass sheet. There are no particular restrictions on the thickness of the gas-barrier layer. The gas-barrier layer is preferably thick enough to serve fully as a barrier against gases. On the other hand, however, the layer is preferably thin enough to ensure flexibility or bendability. In view of those, the gas-barrier layer has a thickness of preferably 0.01 to 3000 µm, more preferably 0.1 to 100 µm. The gas-barrier layer has a water-vapor permeability (moisture permeability) of preferably $10^2$ to $10^{-6}$ $g/m^2 \cdot d$, more preferably $10^1$ to $10^{-5}$ $g/m^2 \cdot d$, further preferably $10^0$ to $10^{-4}$ $g/m^2 \cdot d$. The moisture permeability can be measured according to JIS Z0208 and the like. The gas-barrier layer is preferably formed by dry processes. Examples of the dry processes for forming the gas-barrier layer include: vacuum deposition processes, such as, resistance heating deposition, electron beam deposition, induction heating deposition, and plasma or ion-beam assisted deposition; sputtering processes, such as, reactive sputtering, ion beam sputtering, ECR (electron cyclotron resonance) sputtering; PVD (physical vapor deposition) processes, such as, ion plating; and CVD (chemical vapor deposition) processes employing heat, light or plasma. Among them, preferred are vacuum deposition processes, in which a film of the layer is formed by deposition in vacuum.

It is also preferred to cover the metal nanowire layer 103 and the auxiliary metal wiring 104 with a PET film provided with a UV-cut layer.

The transparent electrode according to the embodiment may furthermore comprise a substrate, which makes it easy to successively form the metal oxide layer 102 and the metal nanowire layer 103 on the substrate. If a transparent substrate is employed, the whole electrode including the substrate can be made highly transparent. Examples of materials for the transparent substrate include: inorganic substances, such as, glass; and resin substances, such as, polyethylene terephthalate (hereinafter, referred to as "PET"), polyethylene naphthalate (hereinafter, referred to as "PEN"), polycarbonate (hereinafter, referred to as "PC"), and polymethyl methacrylate (hereinafter, referred to as "PMMA"). Among them, preferred are flexible organic materials because the transparent electrode of the embodiment can be made rich in flexibility. Further, it is also possible to adopt an opaque substrate, which is used only in the production process of the electrode and then removed after the electrode is formed.

Embodiment 2-1

Figure 2:
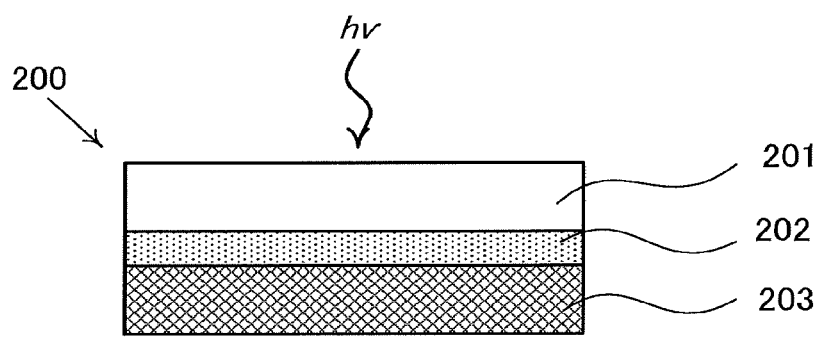
FIG. 2 is a schematic sectional view showing the structure of a photoelectric conversion device (solar cell) according to the embodiment.

The structure of a photoelectric conversion device according to the second embodiment is explained below with reference to FIG. 2. FIG. 2 schematically shows the structure of a solar cell (photoelectric conversion device) 200 according to the embodiment. The solar cell 200 has a function of converting photoenergy hv of incident sunlight or the like into electric power. The solar cell 200 comprises a transparent electrode 201, a photoelectric conversion layer (active layer) 202 formed on one surface of the transparent electrode 201, and a counter electrode 203 formed on the other surface of the photoelectric conversion layer 202 on the side opposite to the transparent electrode 201.

The transparent electrode 201 is the same as that described in Embodiment 1. The photoelectric conversion layer 202 is a semiconductor layer which converts photoenergy of incident light into electric power so as to generate an electric current. The photoelectric conversion layer 202 generally comprises a p-type semiconductor sublayer and an n-type one. The conversion layer can comprise: a laminate structure of p-type polymer and n-type substance; $RNH_3PbX_3$ (in which X is a halogen ion and R is an alkyl group or the like, wherein the halogen ion can be a mixture thereof); or compound semiconductor, such as, CIGS.

Further, the photoelectric conversion layer 202 may comprise: silicon semiconductor; inorganic compound semiconductor, such as, InGaAs, GaAs, chalcopyrite type, CdTe type, InP type or SiGe type; or quantum dot-containing or dye-sensitized transparent semiconductor. Any of them can improve the efficiency and can reduce deterioration of power output.

For the purpose of promoting or blocking injection of charges, a buffer layer may be inserted between the conversion layer 202 and the transparent electrode 201.

The counter electrode 203 is normally a metal electrode, but the transparent electrode according to the embodiment may be adopted as the counter electrode 203. Another buffer layer may be inserted between the counter electrode 203 and the conversion layer 202 for the purpose of promoting or blocking injection of charges.

The buffer layer for the anode can be made of, for example, vanadium oxide, PEDOT/PSS, p-type polymer, vanadium pentoxide ($V_2O_5$), 2,2',7,7'-tetrakis [N,N-di(4-methoxyphenyl)amino]-9,9'-spirobifluorene (hereinafter, referred to as "spiro-OMeTAD"), nickel oxide (NiO), tungsten trioxide ($WO_3$), or molybdenum trioxide ($MoO_3$).

On the other hand, the buffer or charge transport layer for the cathode, which the transparent electrode serves as, can be made of, for example, lithium fluoride (LiF), calcium (Ca), 6,6'-phenyl-$C_{61}$-butyric acid methyl ester ($C_{60}$-PCBM), 6,6'-phenyl-$C_{71}$-butyric acid methyl ester (hereinafter, referred to as "$C_{70}$-PCBM"), indene-$C_{60}$ bisadduct (hereinafter, referred to as "ICBA"), cesium carbonate ($Cs_2CO_3$), titanium dioxide ($TiO_2$), poly[(9,9-bis(3'-(N,N-dimethylamino)propyl-2,7-fluorene)-alt-2,7-(9,9-dioctylfluorene)] (hereinafter, referred to as "PFN"), bathocuproine (hereinafter, referred to as "BCP"), zirconium oxide (ZrO), zinc oxide (ZnO), or polyethyleneimine.

Further, a brookite-type titanium oxide layer can be provided between the photoelectric conversion layer and the transparent electrode. It is known that titanium oxide has three types of crystal structures, namely, rutile, anatase and brookite-type structures. Among them, the titanium oxide layer of anatase-type or brookite-type structure is preferably adopted in the embodiment. More preferably the titanium oxide layer of brookite-type structure is adopted. The brookite-type titanium oxide layer easily interacts with the photoelectric conversion layer, so that excitons generated by light can easily undergo charge separation. The brookite-type titanium oxide layer preferably comprises nanoparticles of brookite-type titanium oxide. Specifically, the nanoparticles preferably have a mean size of 5 to 30 nm. The particle mean size is measured by a particle size distribution analyzer. Those nanoparticles of brookite-type titanium oxide are commercially available, for example, from KOJUNDO CHEMICAL LABORATORY CO., LTD.

The counter electrode 203 may have the same structure as the transparent electrode 201. Further, the counter electrode 203 may comprise unsubstituted planar monolayer graphenes. The unsubstituted monolayer graphene can be formed by a CVD process in which methane, hydrogen and argon are adopted as the reactive gases and a copper foil sheet is employed as a catalyst undercoat. For example, the monolayer graphene and a thermal transfer film are pressed and stuck together, and then the copper undercoat is dissolved to transfer the monolayer graphene onto the transfer film. The procedure is repeated to stack plural monolayer graphenes on the transfer film. After 2 to 4 graphene layers are thus formed, a metallic wiring for current collection is printed thereon with silver paste or the like to produce the counter electrode. The unsubstituted graphene may be replaced with graphene in which carbons are partly substituted with boron atoms. The boron-substituted graphene can be formed from the reactive gases of $BH_3$, methane, hydrogen and argon in the same manner as described above. Those graphenes can be transferred from the thermal transfer film onto a proper substrate of, for example, PET.

The mono- or multi-layer graphene can be doped with a tertiary amine serving as an electron donor compound. The electrode comprising the above graphene layer also functions as a transparent electrode.

On the counter electrode 203, a hole injection layer can be formed. The hole injection layer is, for example, a film of ply(3,4-ethyrenedioxythiophene)/poly(styrenesulfonic acid) composite material (PEDOT:PSS). The thickness thereof is, for example, 50 nm.

The solar cell of the embodiment may have a structure sandwiched between two transparent electrodes. The solar cell having that structure can efficiently utilize light incident from both sides. The energy conversion efficiency thereof is generally 5% or more. Characteristically, the solar cell is flexible and can work stably in a long term.

The counter electrode 203 may be an ITO glass transparent electrode in place of the graphene film. In that case, the solar cell loses flexibility but can utilize light energy very efficiently. Further, the counter electrode may be made of metal, such as, stainless steel, copper, titanium, nickel, chromium, tungsten, gold, silver, molybdenum, tin, zinc, or aluminum. However, that metal electrode tends to be inferior in transparency.

The solar cell according to the embodiment can be also employed as a photosensor.

Embodiment 2-2

Figure 3:
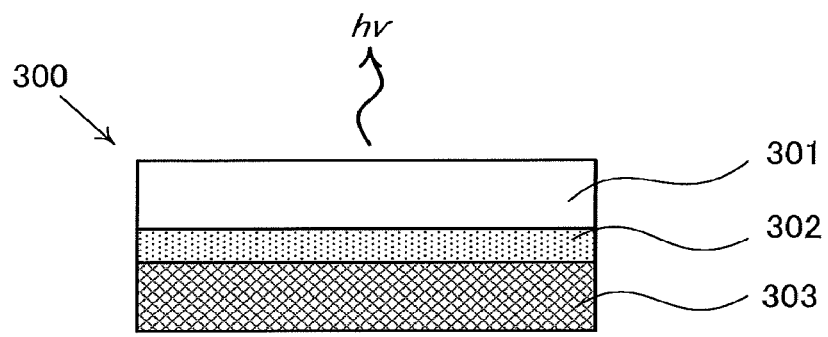
FIG. 3 is a schematic sectional view showing the structure of a photoelectric conversion device (organic EL device) according to the embodiment.

The structure of another photoelectric conversion device according to the second embodiment is explained below with reference to FIG. 3. FIG. 3 schematically shows the structure of an organic EL device (photoelectric conversion device) 300 according to the embodiment. The organic EL device 300 serves as a light-emitting device having a function of converting inputted electric energy into light hv. The organic EL device 300 comprises a transparent electrode 301, a photoelectric conversion layer (luminous layer) 302 formed on one surface of the transparent electrode 301, and a counter electrode 303 formed on the other surface of the photoelectric conversion layer 302 on the side opposite to the transparent electrode 301.

The transparent electrode 301 is the same as that described in Embodiment 1. The photoelectric conversion layer 302 is an organic thin layer in which charges injected from the transparent electrode 301 and from the counter electrode 303 are recombined to convert the electric energy into light. The photoelectric conversion layer 302 normally comprises a p-type semiconductor sublayer and an n-type one. For the purpose of promoting or blocking injection of charges, a buffer layer may be inserted between the conversion layer 302 and the counter electrode 303. Further, another buffer layer may be inserted between the conversion layer 302 and the transparent electrode 301. The counter electrode 303 is normally a metal electrode but may be a transparent electrode.

Embodiment 2-3

Figure 4:
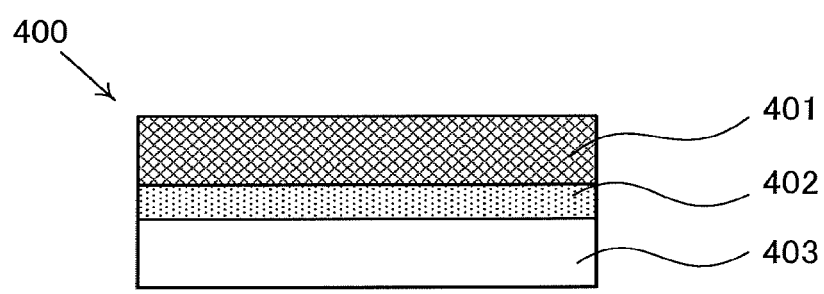
FIG. 4 is a schematic sectional view showing the structure of a liquid crystal device according to the embodiment.

The structure of still another device according to the second embodiment is explained below with reference to FIG. 4. FIG. 4 schematically shows the structure of a liquid crystal device 400 according to the embodiment. The liquid crystal device 400 serves as an optical switch in which orientation of liquid crystal molecules is controlled by application of voltage. The liquid crystal device 400 comprises a transparent electrode 401, a liquid crystal layer 402 formed on one surface of the transparent electrode 401, and a counter electrode 403 formed on the other surface of the liquid crystal layer 402 on the side opposite to the transparent electrode 401.

The transparent electrode 401 is the same as that described in Embodiment 1. The liquid crystal layer 402 is preferably made of liquid-crystal microcapsules, which are polymer microcapsules enclosing liquid crystal molecules. The layer of liquid-crystal microcapsules can be formed by wet-coating and drying, and thereafter a continuous transparent metal oxide layer having an amorphous component, a metal nanowire layer and an auxiliary metal wiring covering a part of the metal nanowire layer can be formed thereon successively in order.

Embodiment 3

FIGS. 5A to 5D schematically illustrate a method for manufacturing a device 100 according to the embodiment. This method comprises the steps of:

(a) forming an active layer on a counter electrode, (b) forming, on said active layer, a metal oxide layer having an amorphous structure and electroconductivity, and (c) forming a metal nanowire layer on said metal oxide layer, and further (d) forming, before or after said step (c), an auxiliary metal wiring which covers a part of said metal nanowire layer or of said metal oxide layer and which is connected to said metal nanowire layer.

Those steps are individually explained below.

First, a counter electrode 500 is prepared and then an active layer 501 is formed thereon.

The counter electrode 500 can be freely selected according to the aimed use. If the whole device needs to be light-transparent, the counter electrode may be the transparent electrode according to the embodiment. In that case, the metal oxide layer in the electrode is preferably placed on the device active layer side. If not required to be transparent, the counter electrode may be less transparent.

The counter electrode may be a thin metal film. If the counter electrode is a thin metal film, the thin metal film may be either directly formed on the device active layer or independently formed and then laminated thereon.

Figure 5A:
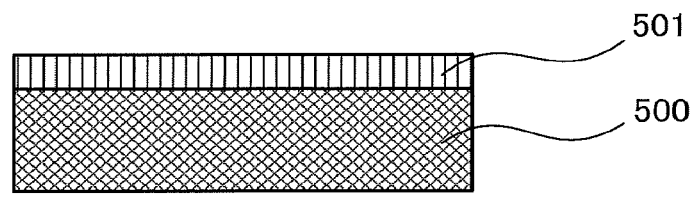
FIGS. 5A to 5D schematically illustrate a process for manufacturing a device according to the embodiment.

Subsequently, an active layer 501 is formed on the counter electrode 500 (Step(a), FIG. 5A). The active layer has a structure selected freely according to the aimed use, and the formation method thereof is not particularly restricted and hence can be freely selected from known processes.

Figure 5B:
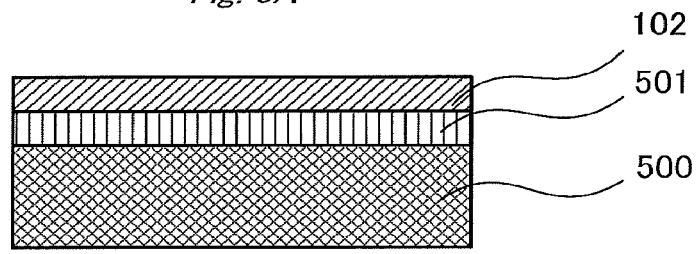

Then, a metal oxide layer 102 is formed on the active layer (Step(b), FIG. 5B). In the embodiment, the metal oxide layer 102 has an amorphous structure and electroconductivity. As the metal oxide, ITO, FTO or AZO is preferably adopted. The metal oxide layer is normally formed by sputtering. The sputtering procedure is preferably carried out at a low temperature. Specifically, the sputtering temperature is preferably 150° C. or less. The layer may be formed by printing.

The metal oxide layer 102 may be combined with a thin metal film. In that case, the thin metal film may be either directly formed on the metal oxide layer or independently formed and then laminated thereon. In addition to the thin metal film, the metal oxide layer may be further combined with another metal oxide layer to form a laminate structure of metal oxide layer/thin metal film/metal oxide layer.

Figure 5C:
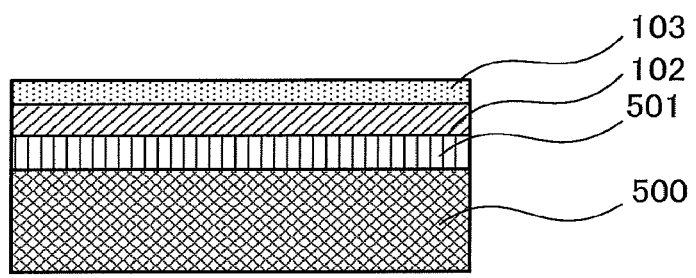

Thereafter, a metal nanowire layer 103 is formed on the metal oxide layer (Step(c), FIG. 5C). The nanowire layer can be formed, for example, by a transfer process. For example, a dispersion of silver nanowires is sprayed onto a sheet of polydimethylsiloxane or polytetrafluoroethylene (PTFE sheet), then dried, heated and pressed against the metal oxide layer. Thus, a metal nanowire layer can be transferred. Otherwise, the silver nanowire dispersion may be directly applied on the metal oxide layer and dried to form a metal nanowire layer.

Figure 5D:
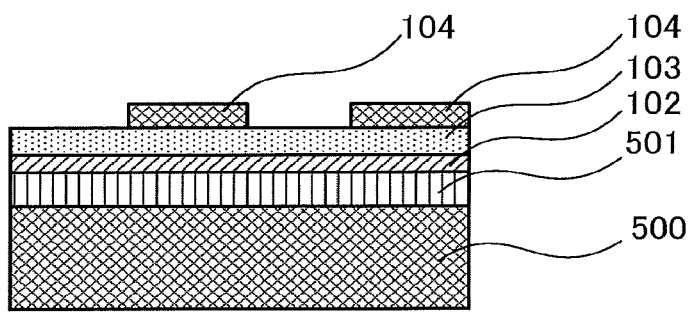

The method of the embodiment further comprises the step (Step (d), FIG. 5D) of forming an auxiliary metal wiring. This step is typically carried out after the step (c), but can be conducted before the step (c).

The auxiliary metal wiring can be formed, for example, by sputtering or vapor deposition through a mask. The conditions of sputtering or vapor deposition can be freely selected, but it is preferred to carry out the process at such a temperature as to avoid crystallization of the metal oxide layer serving as an undercoat layer.

Prior to the formation of the active layer, a buffer layer may be formed on the counter electrode. Further, another buffer layer may be formed on the active layer before the metal oxide layer is formed.

Furthermore, prior to the formation of the metal oxide layer, a graphene layer may be formed on the active layer. Still further, a graphene layer may be formed on the metal oxide layer before the metal nanowire layer is formed. Still furthermore, after the auxiliary metal wiring is formed, the metal nanowire layer and the auxiliary metal wiring can be covered with a graphene layer.

The method may further comprise the step of forming an insulating layer, which functions also as a UV-cut layer or a gas-barrier layer, to cover the metal nanowire layer and the auxiliary metal wiring.

The method may furthermore comprise the step of laminating a PET film or the like provided with a UV-cut layer or a gas-barrier layer.

EXAMPLES

The embodiments are further explained by the following examples.

Example 1

A transparent electrode 100 having the structure shown in FIG. 1 is produced. A 2 μm-thick PMMA film is formed on a hydrophilic glass substrate by spin-coating. Subsequently, an ITO layer 102 (thickness: 300 nm) having an amorphous structure (hereinafter, referred to as "a-ITO") is formed thereon by sputtering at room temperature. The layer shows an X-ray diffraction pattern in which the peak corresponding to (400) is not found. The surface resistance is measured by the four-point probe method, and found to be 100 to 150 Ω/square. Thereafter, an aqueous dispersion of silver nanowires having a mean diameter of 50 nm and a mean length of 20 μm is applied by spin-coating and then dried to form a silver nanowire layer 103. The surface resistance thereof is found to be 10 to 12 Ω/square. After that, gold is sputtered through a mask on a 20% area of the transparent electrode so as to form auxiliary metal wiring 104. The whole laminate structure is then coated with a thermosetting silicone resin, and heated to form a 40-μm thick insulating layer (not shown). The obtained structure is immersed in water, and then the glass substrate is removed in water.

Subsequently, after the PMMA film is dissolved and removed in acetone, the insulating layer is screen-printed with UV-cut ink to form a UV-cut layer (not shown). The UV-cut layer is then coated with silica by CVD to form a gas-barrier layer (not shown). Thus, a transparent electrode 100 is produced.

Even if this transparent electrode is left in air having a humidity of 80% at 60° C. for 100 hours, the silver nanowires are not corroded and the electroconductivity is not changed.

Example 2

Figure 6:
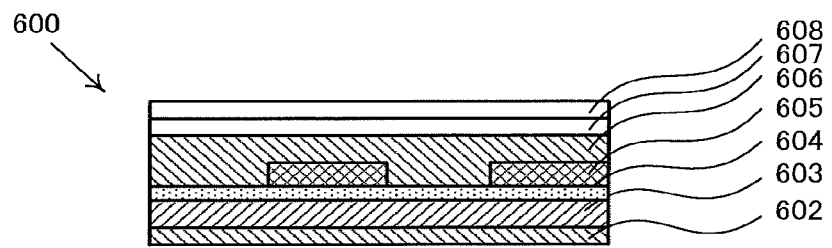
FIG. 6 is a schematic sectional view showing the structure of a transparent electrode in Example 2.

A transparent electrode 600 having the structure shown in FIG. 6 is produced. First, an ITO layer 602 is formed on a PMMA/glass substrate (not shown) by sputtering. The ITO layer 602 has a laminate structure (thickness: 100 nm) of a-ITO/silver alloy/a-ITO. The surface resistance thereof is found to be 15 to 20 Ω/square. The surface is then coated with a shielding layer 603 in which planar N-graphene films are stacked in four layers on average. Each graphene film comprises carbon atoms partly substituted with nitrogen atoms.

The shielding layer is formed in the following manner. At the beginning, a sheet of Cu-foil is irradiated to heat with laser beams and then annealed to grow crystallites.

The Cu-foil sheet thus surface-treated is adopted as a catalyst undercoat, on which a planar monolayer N-graphene film is formed from a reactive gas mixture of ammonia, methane, hydrogen and argon (15:60:65:200 ccm) by CVD method at 1000° C. for 5 minutes. In most cases, a monolayer N-graphene film is formed as a result of that CVD process. However, depending on the conditions, a two or more-layer N-graphene film is partly formed. Subsequently, the formed N-graphene film is further treated in an ammonia-argon mixed gas stream at 1000° C. for 5 minutes, and then cooled in an argon stream. The obtained monolayer N-graphene film and a thermal transfer film are pressed and stuck together, and then they are immersed in copper(II) chloride etchant, so that the copper undercoat is dissolved to transfer the monolayer N-graphene film onto the transfer film. Those procedures are repeated to stack four monolayer N-graphene films on the thermal transfer film. In this way, a multilayer graphene film is produced.

Thereafter, the thermal transfer film is laminated on the structure of a-ITO/silver alloy/a-ITO/PMMA/glass substrate, and then heated to transfer the N-graphene film onto the structure of a-ITO/silver alloy/a-ITO/PMMA/glass substrate to form a shielding layer 603.

The nitrogen content in the graphene film is measured by XPS, and found to be 1 to 2 atm % under the above conditions. The atomic ratio between carbon and oxygen is also measured by XPS, and found to be 100:1 to 200:1.

Subsequently, an aqueous dispersion of silver nanowires having a mean diameter of 100 nm and a mean length of 50 μm is applied by spin-coating and then dried to form a silver nanowire layer 604. The surface resistance thereof is found to be 5 to 10 Ω/square. After that, gold is sputtered through a mask on a 5% area of the transparent electrode so as to form an auxiliary metal wiring 605. The whole laminate structure is then coated with a thermosetting silicone resin, and heated to form a 40-μm thick insulating layer 606. The obtained structure is immersed in water, and the glass substrate is removed in water. Thereafter, the PMMA is dissolved and removed in acetone, and then the insulating layer is screen-printed with UV-cut ink containing 2-hydroxy-4-methoxy benzophenone, to form a UV-cut layer 607. The UV-cut layer is then coated with alumina by sputtering to form a gas-barrier layer 608. Thus, a transparent electrode 600 is produced.

Even if this transparent electrode is left in air having a humidity of 80% at 60° C. for 100 hours, the silver nanowires are not corroded and the electroconductivity is not changed.

Comparative Example 1

A 2 μm-thick PMMA film is formed on a hydrophilic glass substrate by spin-coating. Subsequently, an aqueous dispersion of crystalline ITO powder is applied thereon and dried to form a metal oxide layer 102 of ITO (thickness: 300 nm). The surface resistance is measured by the four-point probe method, and found to be 30 to 50 Ω/square. Thereafter, an aqueous dispersion of silver nanowires having a mean diameter of 50 nm and a mean length of 20 μm is applied by spin-coating and then dried to form a silver nanowire layer 103. The surface resistance thereof is found to be 10 to 12 Ω/square. After that, gold is sputtered through a mask on a ¼ area of the transparent electrode so as to form an auxiliary metal wiring 104. The whole laminate structure is then coated with a thermosetting silicone resin, and heated to form a 40-μm thick insulating layer. The obtained structure is immersed in water, and the glass substrate is removed in water. Subsequently, after the PMMA film is dissolved and removed in acetone, the insulating layer is screen-printed with UV-cut ink to form a UV-cut layer. The UV-cut layer is then coated with silica by CVD to form a gas-barrier layer. Thus, a transparent electrode 100 is produced.

This transparent electrode is left in air having a humidity of 80% at 60° C. for 100 hours. As a result, the silver nanowires are found to be corroded and the electroconductivity is lowered.

Example 3

Figure 7:
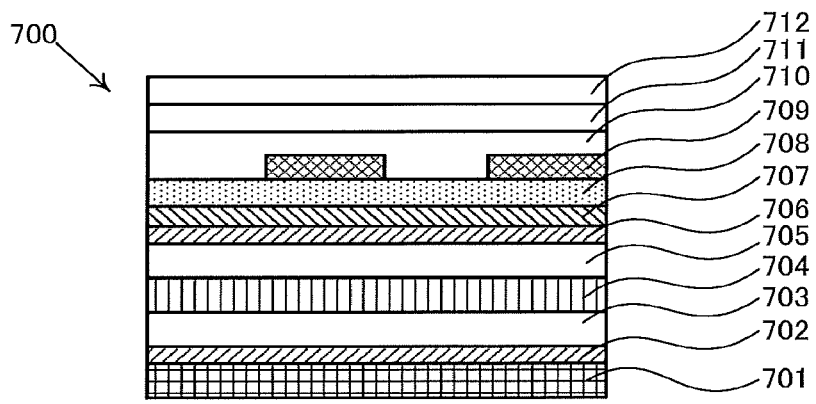
FIG. 7 is a schematic sectional view showing the structure of a solar cell in Example 3.

A solar cell 700 shown in FIG. 7 is produced.

A sheet of stainless steel-foil 701 provided with an insulating ceramic film on one surface is prepared, and the other surface thereof is treated with dilute hydrochloric acid to remove a surface oxidized film. The surface thus treated is then coated with an aqueous solution of graphene oxide by means of a bar-coater, to form a graphene oxide layer. After dried at 90° C. for 20 minutes, the graphene oxide layer is treated with hydrazine hydrate vapor at 110° C. for 1 hour to convert into a shielding layer 702. The shielding layer is a N-graphene film having two layers on average. In the N-graphene film, carbon atoms of the graphene oxide are partly substituted with nitrogen atoms.

The N-graphene film 702 is coated with an aqueous solution of PEDOT•PSS by means of a bar-coater. The applied solution is dried at 100° C. for 30 minutes to form a buffer layer 703 (thickness: 50 nm) containing PEDOT•PSS.

The buffer layer 73 is then coated with a chlorobenzene solution containing C60-PCBM and poly(3-hexylthiophene-2,5-diyl) (hereinafter, referred to as "P3HT") by means of a bar-coater. The applied solution is dried at 100° C. for 20 minutes, to form a photoelectric conversion layer 704.

The photoelectric conversion layer 704 is further coated with a toluene solution containing C60-PCBM by means of a bar-coater, and dried to form a buffer layer 705.

The buffer layer 705 is furthermore coated with an aqueous solution of graphene oxide by means of a bar-coater, to form a graphene oxide layer. After dried at 90° C. for 20 minutes, the graphene oxide layer is treated with hydrazine hydrate vapor at 110° C. for 1 hour to convert into a shielding layer 706. The shielding layer is a two-layer N-graphene film in which carbon atoms of the graphene oxide are partly substituted with nitrogen atoms.

The surface of the shielding layer 706 is coated with a-ITO (thickness: 400 nm) 707 by sputtering at room temperature. The formed ITO layer is then annealed in a nitrogen atmosphere under exposure to an IR lamp, so as to partly crystallize the ITO. The layer shows an X-ray diffraction pattern in which the peak height ratio between (222) and (400) is 4:1.

Thereafter, an aqueous dispersion of silver nanowires having a mean diameter of 50 nm and a mean length of 20 μm is applied by spin-coating and then dried to form a silver nanowire layer 708. After that, copper is sputtered in a mesh shape on a 10% area of the transparent electrode so as to form an auxiliary metal wiring 709. The whole laminate structure is then coated with a thermosetting silicone resin, and heated to form a 40-μm thick insulating layer 701. Subsequently, the insulating layer is screen-printed with UV-cut ink to form a UV-cut layer 711. The UV-cut layer is then coated with silica by CVD to form a gas-barrier layer 712. Finally, the periphery is sealed to produce a solar cell.

The obtained solar cell converts sunlight of 1 sun at an efficiency of 5% or more. Even if the cell is left for a month, the efficiency deteriorates only by less than 3%.

Comparative Example 2

The procedure of Example 3 is repeated except for not forming the auxiliary metal wiring 709, to produce a solar cell.

The obtained solar cell converts sunlight of 1 sun at an efficiency of 3.5%, and the conversion efficiency deteriorates.

Example 4

Figure 8:
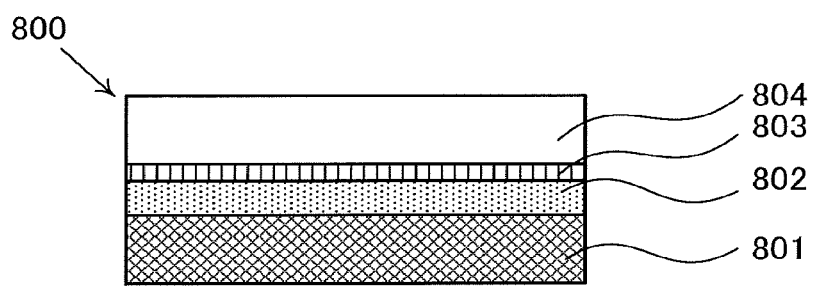
FIG. 8 is a schematic sectional view showing the structure of an organic EL device in Example 4.

An organic EL device 800 shown in FIG. 8 is produced.

The ITO surface of the transparent electrode 801 obtained in Example 1 is coated with an aqueous solution of PEDOT•PSS by means of a bar-coater, and then dried at 100° C. for 30 minutes to form a buffer layer 802 (thickness: 50 nm) containing PEDOT•PSS.

On the buffer layer 802, N,N'-di-1-naphthyl-N,N'-diphenyl-1,1'-biphenyl-4,4'-diamine (hereinafter, referred to as "NPD"), which functions as an P-type organic semiconductor, is vapor-deposited to form a 30-nm thick layer. Successively, tris(8-hydroxyquinolinato)aluminum ($Alq_3$), which functions as an N-type semiconductor, is vapor-deposited thereon to form a layer (40 nm) serving as a luminous layer. Thus, a photoelectric conversion layer 803 is produced. Further, a silver-magnesium electrode 804 is formed thereon by sputtering. Finally, the periphery is sealed to produce an organic EL device.

The obtained organic EL device hardly deteriorates in output light. Even after continuous operation for 1000 hours, the output decreases only by 10%.

Example 5

Figure 9:
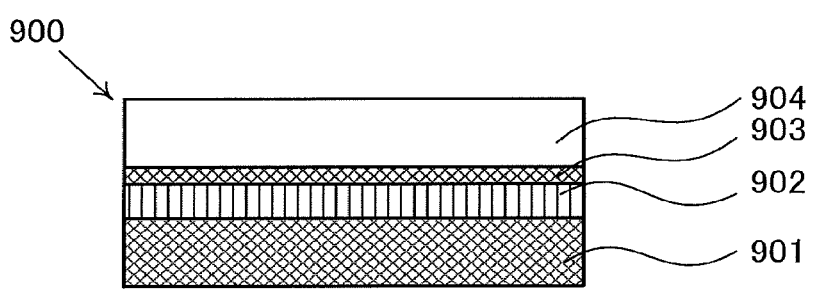
FIG. 9 is a schematic sectional view showing the structure of a liquid crystal cell in Example 5.

A liquid crystal cell 900 shown in FIG. 9 is produced.

An ITO electrode 901 on a PET film is coated with an aqueous dispersion of liquid crystal microcapsules. The applied dispersion is dried to form a liquid crystal microcapsule layer 902. Subsequently, the microcapsule layer is coated with an aqueous dispersion of PEDOT•PSS containing sorbitol. The applied dispersion is then dried to form an electroconductive adhesive layer 903. Meanwhile, a transparent electrode 904 is produced in the same manner as in Example 1. The transparent electrode 904 is then so laminated on the adhesive layer that the ITO surface of the electrode may be in contacted with the adhesive layer. Finally, the periphery is sealed to produce a liquid crystal cell. This device is opaque, but becomes transparent under application of voltage. Accordingly, it can serve as an optical switch.

The obtained liquid crystal cell hardly deteriorates in drive voltage light. Even after continuous operation for 1000 hours, the voltage increases only by 5%.

Example 6

Figure 10:
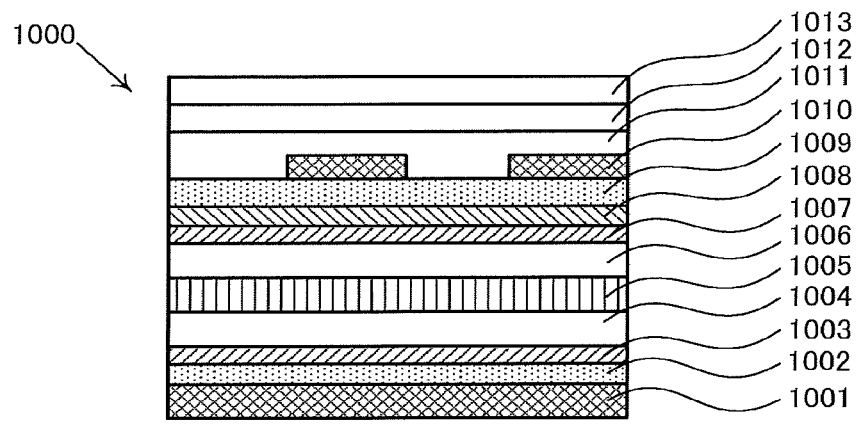
FIG. 10 is a schematic sectional view showing the structure of a solar cell in Example 6.

A solar cell 1000 shown in FIG. 10 is produced.

A sheet of aluminum-foil 1001 provided with an insulating polymer film on one surface is prepared. On the other surface thereof, a titanium electrode layer 1002 is formed by sputtering and then coated with an aqueous solution of graphene oxide by means of a bar-coater, to form a graphene oxide layer. After dried at 90° C. for 20 minutes, the graphene oxide layer is treated with hydrazine hydrate vapor at 110° C. for 1 hour to convert into a shielding layer 1003.

The shielding layer is a two-layer N-graphene film in which carbon atoms of the graphene oxide are partly substituted with nitrogen atoms.

The N-graphene film 1003 is then coated with a propanol solution containing titanium propoxide by means of a bar-coater. The applied solution is dried at 100° C. for 30 minutes to form a buffer layer 1004 (thickness: 20 nm) containing titanium oxide.

The buffer layer 1004 is further coated with a chlorobenzene solution containing C60-PCBM and poly(3-hexylthiophene-2,5-diyl) (hereinafter, referred to as "P3HT") by means of a bar-coater. The applied solution is dried at 100° C. for 20 minutes, to form a photoelectric conversion layer 1005.

The photoelectric conversion layer 1005 is furthermore coated with molybdenum oxide by sputtering to form a buffer layer 1006.

The buffer layer 1006 is still further coated with an aqueous solution of graphene oxide by means of a bar-coater, to form a graphene oxide layer. After dried at 90° C. for 20 minutes, the graphene oxide layer is treated with hydrazine hydrate vapor at 110° C. for 1 hour to convert into a shielding layer 1007. The shielding layer is a N-graphene film having two layers on average. In the N-graphene film, carbon atoms of the graphene oxide are partly substituted with nitrogen atoms.

The surface of the shielding layer 1007 is then coated with an aluminum-doped zinc oxide layer 1008 (thickness: 400 nm) by sputtering at room temperature. The formed aluminum-doped zinc oxide layer has an amorphous structure (hereinafter, this layer is referred to as "a-AZO layer"). The a-AZO layer is then annealed in a nitrogen atmosphere under exposure to an IR lamp, so as to partly crystallize the aluminum-doped zinc oxide.

Thereafter, an aqueous dispersion of copper nanowires having a mean diameter of 100 nm and a mean length of 10 μm is applied by spin-coating and then dried to form a copper nanowire layer 1009. After that, copper is sputtered in a comb-shape on a 10% area of the transparent electrode so as to form an auxiliary metal wiring 1010. The whole laminate structure is then coated with an ethanol solution of tetramethoxysilane, and heated to form a 20-μm thick insulating layer 1011. Subsequently, the insulating layer is screen-printed with UV-cut ink to form a UV-cut layer 1012. The UV-cut layer is then coated with silica by CVD to form a gas-barrier layer 1013. Finally, the periphery is sealed to produce a solar cell.

The obtained solar cell converts sunlight of 1 sun at an efficiency of 4.5% or more. Even if the cell is left for a month, the efficiency deteriorates only by less than 2%.

Example 7

Figure 11:
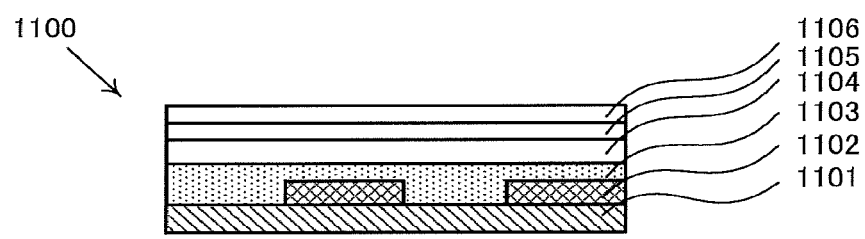
FIG. 11 is a schematic sectional view showing the structure of a transparent electrode in Example 7.

A transparent electrode 1100 having the structure shown in FIG. 11 is produced. A 2 μm-thick PMMA film is formed on a hydrophilic glass substrate by spin-coating. Subsequently, an AZO layer 1101 (thickness: 300 nm) having an amorphous structure is formed thereon by sputtering at room temperature. The surface resistance is measured by the four-point probe method, and found to be 120 to 160 Ω/square. Thereafter, gold is sputtered through a mask on a 25% area of the transparent electrode so as to form an auxiliary metal wiring 1102. Subsequently, an aqueous dispersion of copper nanowires having a mean diameter of 100 nm and a mean length of 10 μm is applied by spin-coating and then dried to form a copper nanowire layer 1103. The surface resistance is found to be 12 to 15 Ω/square. The whole laminate structure is then coated with a thermosetting silicone resin, and heated to form a 40-μm thick insulating layer 1104. The obtained structure is immersed in water, and the glass substrate is removed in water. Subsequently, after the PMMA film is dissolved and removed in acetone, the insulating layer is screen-printed with UV-cut ink to form a UV-cut layer 1105. The UV-cut layer is then coated with silica by CVD to form a gas-barrier layer 1106. Thus, a transparent electrode 1100 is produced.

Even if this transparent electrode is left in air having a humidity of 80% at 60° C. for 150 hours, the copper nanowires are not corroded and the electroconductivity is not changed.

Example 8

Figure 12:
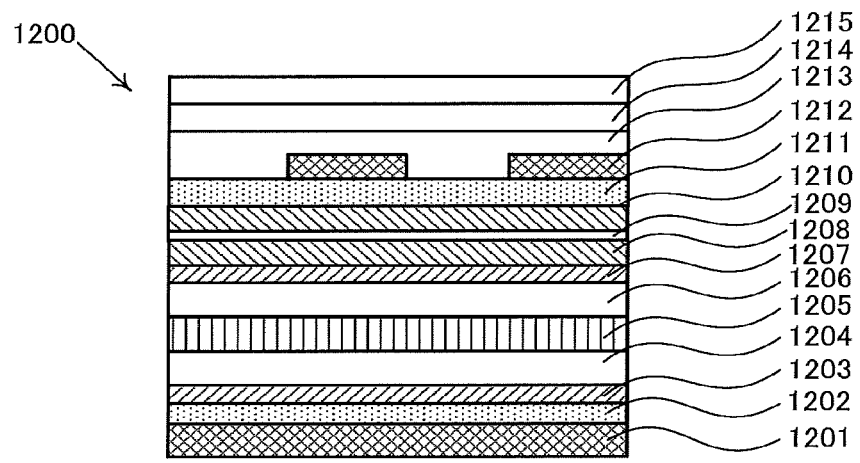
FIG. 12 is a schematic sectional view showing the structure of a solar cell in Example 8.

A solar cell 1200 shown in FIG. 12 is produced.

A sheet of aluminum-foil 1201 provided with an insulating polymer film on one surface is prepared. On the other surface thereof, a titanium electrode layer 1202 is formed by sputtering and then coated with an aqueous solution of graphene oxide by means of a bar-coater, to form a graphene oxide layer. After dried at 90° C. for 20 minutes, the graphene oxide layer is treated with hydrazine hydrate vapor at 110° C. for 1 hour to convert into a shielding layer 1203. The shielding layer is a N-graphene film having three layers on average. In the N-graphene film, carbon atoms of the graphene oxide are partly substituted with nitrogen atoms.

The N-graphene film 1203 is coated with a propanol solution containing titanium propoxide by means of a bar-coater. The applied solution is dried at 100° C. for 30 minutes to form a buffer layer 1204 (thickness: 20 nm) containing titanium oxide.

The buffer layer 1204 is further coated with a chlorobenzene solution containing C60-PCBM and poly(3-hexylthiophene-2,5-diyl) (hereinafter, referred to as "P3HT") by means of a bar-coater. The applied solution is dried at 100° C. for 20 minutes, to form a photoelectric conversion layer 1205.

The photoelectric conversion layer 1205 is furthermore coated with molybdenum oxide by sputtering to form a buffer layer 1206.

The buffer layer 1206 is still further coated with an aqueous solution of graphene oxide by means of a bar-coater, to form a graphene oxide layer. After dried at 90° C. for 20 minutes, the graphene oxide layer is treated with hydrazine hydrate vapor at 110° C. for 1 hour to convert into a shielding layer 1207. The shielding layer is a N-graphene film having two layers on average. In the N-graphene film, carbon atoms of the graphene oxide are partly substituted with nitrogen atoms.

The surface of the shielding layer 1207 is then coated with an a-AZO layer 1208 (thickness: 400 nm) by sputtering at room temperature. The formed layer is then annealed in a nitrogen atmosphere under exposure to an IR lamp, so as to partly crystallize the aluminum-doped zinc oxide.

Thereafter, on the a-AZO layer 1208, a 10-nm thick silver-palladium alloy layer 1209 is formed by sputtering. Further, a second a-AZO layer 1210 having 30 nm thickness is formed thereon by sputtering.

Subsequently, an aqueous dispersion of copper nanowires having a mean diameter of 100 nm and a mean length of 10 μm is applied thereon by spin-coating and then dried to form a copper nanowire layer 1211. After that, copper is sputtered in a mesh-shape on a 2% area of the transparent electrode so as to form an auxiliary metal wiring 1212. The whole laminate structure is then coated with an ethanol solution of tetramethoxysilane, and heated to form a 20-µm thick insulating layer 1213. The insulating layer is then screen-printed with UV-cut ink to form a UV-cut layer 1214. The UV-cut layer is further coated with silica by CVD to form a gas-barrier layer 1215. Finally, the periphery is sealed to produce a solar cell.

The obtained solar cell converts sunlight of 1 sun at an efficiency of 6% or more. Even if the cell is left for a month, the efficiency deteriorates only by less than 2%.

Comparative Example 3

The procedure of Example 8 is repeated except for not forming the metal nanowire layer 1211, to produce a solar cell.

The obtained solar cell converts sunlight of 1 sun at an efficiency of 4.5%, and the conversion efficiency deteriorates.

Example 9

Figure 13:
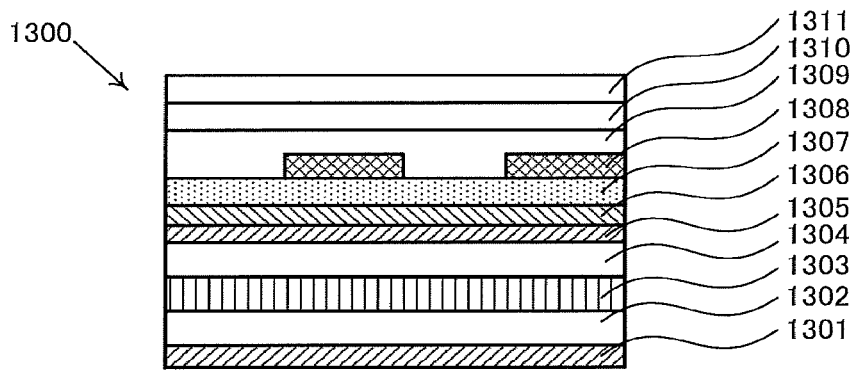
FIG. 13 is a schematic sectional view showing the structure of a solar cell in Example 9.

A solar cell 1300 shown in FIG. 13 is produced.

A transparent electrode 1301 obtained in Example 2 is coated with a propanol solution containing titanium propoxide by means of a bar-coater. The applied solution is dried at 100° C. for 30 minutes to form a buffer layer 1302 (thickness: 20 nm) containing titanium oxide.

The buffer layer 1302 is coated with a chlorobenzene solution containing C60-PCBM and poly(3-hexylthiophene-2,5-diyl) (hereinafter, referred to as "P3HT") by means of a bar-coater. The applied solution is dried at 100° C. for 20 minutes, to form a photoelectric conversion layer 1303.

The photoelectric conversion layer 1303 is further coated with molybdenum oxide by sputtering to form a buffer layer 1304.

The buffer layer 1304 is furthermore coated with an aqueous solution of graphene oxide by means of a bar-coater, to form a graphene oxide layer. After dried at 90° C. for 20 minutes, the graphene oxide layer is treated with hydrazine hydrate vapor at 110° C. for 1 hour to convert into a shielding layer 1205. The shielding layer is a N-graphene film having two layers on average. In the N-graphene film, carbon atoms of the graphene oxide are partly substituted with nitrogen atoms.

The surface of the shielding layer 1305 is then coated with an a-AZO layer 1306 (thickness: 400 nm) by sputtering at room temperature. The formed layer is then annealed in a nitrogen atmosphere under exposure to an IR lamp, so as to partly crystallize the aluminum-doped zinc oxide.

Independently, an aqueous dispersion of silver nanowires having a mean diameter of 90 nm and a mean length of 25 µm is applied on a PTFE sheet by spray-coating to form a silver nanowire layer. The silver nanowire layer is then heated and pressed with a roller against the a-AZO layer 1306, so to transfer from the PTFE sheet onto the a-AZO layer 1306. Thus, a silver nanowire layer 1307 is provided. After that, copper is sputtered in a mesh-shape on a 10% area of the transparent electrode so as to form an auxiliary metal wiring 1308. The whole laminate structure is then coated with an ethanol solution of tetramethoxysilane, and heated to form a 20-µm thick insulating layer 1309. The insulating layer is then screen-printed with UV-cut ink to form a UV-cut layer 1310. The UV-cut layer is further coated with silica by CVD to form a gas-barrier layer 1311. Finally, the periphery is sealed to produce a solar cell.

The obtained solar cell is colored but transparent, and converts sunlight of 1 sun at an efficiency of 3% or more. Even if the cell is left for a month, the efficiency deteriorates only by less than 2%.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the invention.

The invention claimed is:

1. A transparent electrode having a laminate structure of: a metal oxide layer having an amorphous structure and electroconductivity, and a transparent metal nanowire layer; and further comprising an auxiliary metal wiring which covers a part of said transparent metal nanowire layer or of said metal oxide layer and which is contacted to said transparent metal nanowire layer and said metal oxide layer,
    wherein said metal oxide layer has a larger surface resistance than said transparent metal nanowire layer and metal nanowires in said transparent metal nanowire layer have diameters of 10 to 500 nm and lengths of 0.1 to 50 µm, and
    said transparent electrode further comprising a nitrogen-doped graphene layer placed between said metal oxide layer and said transparent metal nanowire layer.

2. The transparent electrode according to claim 1, wherein said metal oxide layer has continuity.

3. The transparent electrode according to claim 1, wherein said transparent metal nanowire layer and said auxiliary metal wiring are covered with an insulating layer of polymer or of insulating metal oxide.

4. The transparent electrode according to claim 1, wherein said metal oxide layer comprises indium-tin complex oxide or aluminum-zinc complex oxide.

5. The transparent electrode according to claim 1, wherein said transparent metal nanowire layer comprises silver or silver alloys.

6. A device comprising:
    the transparent electrode according to claim 1,
    an active layer, and
    a counter electrode.

7. A method for manufacturing said device according to claim 6, comprising the steps of:
    (a) forming an active layer on a counter electrode,
    (b) forming, on said active layer, a metal oxide layer having an amorphous structure and electroconductivity, and
    (c) forming a metal nanowire layer on said metal oxide layer, and further
    (d) forming, before or after said step (c), an auxiliary metal wiring as a current collector which covers a part of said metal nanowire layer or of said metal oxide layer and which is contacted to said metal nanowire layer and said metal oxide layer.

8. The method according to claim 7, wherein said metal nanowire layer is formed by a transfer process or by a wet-coating process.

9. The method according to claim 7, wherein said metal oxide layer is formed by a sputtering process.

10. The method according to claim 9, wherein said sputtering process is carried out at a temperature atmosphere of 150° C. or less.

11. The transparent electrode according to claim 1, where said metal nanowires in said transparent metal nanowire layer have diameters of 20 to 150 nm.

12. The transparent electrode according to claim 1, where said metal nanowires in said transparent metal nanowire layer have diameters of 35 to 120 nm.

13. A transparent electrode having a laminate structure of: a metal oxide layer having an amorphous structure and electroconductivity, and a transparent metal nanowire layer; and further comprising an auxiliary metal wiring as a current collector which covers a part of said transparent metal nanowire layer or of said metal oxide layer and which is contacted to said metal nanowire layer and said metal oxide layer, said transparent electrode further comprising a nitrogen-doped graphene layer placed between said metal oxide layer and said transparent metal nanowire layer.

14. A transparent electrode having a laminate structure of: a metal oxide layer having an amorphous structure and electroconductivity, and a transparent metal nanowire layer; and further comprising an auxiliary metal wiring which covers a part of said transparent metal nanowire layer or of said metal oxide layer and which is contacted to said transparent metal nanowire layer and said metal oxide layer, wherein said metal oxide layer has a larger surface resistance than said transparent metal nanowire layer.

15. A transparent electrode having a laminate structure of: a metal oxide layer having an amorphous structure and electroconductivity, and a metal nanowire layer; and further comprising an auxiliary metal wiring which covers a part of said metal nanowire layer or of said metal oxide layer and which is contacted to said metal nanowire layer and said metal oxide layer, wherein said metal oxide layer has a larger surface resistance than said metal nanowire layer.

\* \* \* \* \*